(12) United States Patent
Ono (10) Patent No.: US 7,986,353 B2
(45) Date of Patent: Jul. 26, 2011

(54) IMAGE SENSING APPARATUS AND IMAGING SYSTEM

(75) Inventor: Toshiaki Ono, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 366 days.

(21) Appl. No.: 12/354,442

(22) Filed: Jan. 15, 2009

(65) Prior Publication Data
US 2009/0190017 A1 Jul. 30, 2009

(30) Foreign Application Priority Data
Jan. 28, 2008 (JP) .................................. 2008-016842

(51) Int. Cl.
*H04N 5/217* (2011.01)
*H04N 3/14* (2006.01)

(52) U.S. Cl. ..................... 348/241; 348/294; 257/115
(58) Field of Classification Search .................. 348/241, 348/294, 299–300
See application file for complete search history.

(56) References Cited

U.S. PATENT DOCUMENTS

| | | | | |
|---|---|---|---|---|
| 5,856,686 A | * | 1/1999 | Watanabe et al. | 257/291 |
| 6,407,440 B1 | * | 6/2002 | Rhodes | 257/462 |
| 6,453,008 B1 | * | 9/2002 | Sakaguchi et al. | 378/98.7 |
| 6,483,541 B1 | | 11/2002 | Yonemoto et al. | 348/302 |
| 6,974,718 B2 | * | 12/2005 | Agarwal | 438/57 |
| 7,236,197 B2 | * | 6/2007 | Goto | 348/308 |
| 7,884,401 B2 | * | 2/2011 | Shim | 257/292 |
| 2002/0175283 A1 | * | 11/2002 | Chang et al. | 250/315.3 |
| 2006/0007504 A1 | | 1/2006 | Inaba et al. | 355/463 |
| 2007/0278536 A1 | | 12/2007 | Adachi | 257/239 |
| 2008/0036890 A1 | | 2/2008 | Yamashita et al. | 348/308 |
| 2008/0036891 A1 | | 2/2008 | Ono et al. | 348/308 |
| 2008/0211950 A1 | | 9/2008 | Ono et al. | 348/308 |

FOREIGN PATENT DOCUMENTS

| | | |
|---|---|---|
| JP | 10-126697 A | 5/1998 |
| JP | 2006-25146 A | 1/2006 |
| JP | 2006-165006 A | 6/2006 |
| JP | 2007-0336306 A | 12/2007 |

* cited by examiner

*Primary Examiner* — Hung H Lam
(74) *Attorney, Agent, or Firm* — Fitzpatrick, Cella, Harper & Scinto

(57) ABSTRACT

An image sensing apparatus includes a pixel array including a light-shielded area where light-shielded pixels are arranged, and an effective area where non-light-shielded pixels are arranged. Each of the light-shielded pixels includes a first photoelectric conversion unit, a first charge-voltage converter which converts charges generated in the first photoelectric conversion unit into a voltage, and a first amplification transistor functioning as a MOS transistor which receives, at the gate, the voltage converted by the first charge-voltage converter. Each of the non-light-shielded pixels includes a second photoelectric conversion unit, a second charge-voltage converter which converts charges generated in the second photoelectric conversion unit into a voltage, and a second amplification transistor functioning as a MOS transistor which receives, at the gate, the voltage converted by the second charge-voltage converter. The gate capacitance of the first amplification transistor is larger than that of the second amplification transistor.

8 Claims, 7 Drawing Sheets

IMAGE SENSING APPARATUS AND IMAGING SYSTEM

BACKGROUND OF THE INVENTION

1. Field of the Invention

The present invention relates to an image sensing apparatus and imaging system.

2. Description of the Related Art

Image sensing apparatuses typified by a CMOS (Complementary Metal Oxide Semiconductor) image sensor have a pixel array where pixels are arrayed in the row and column directions. Some image sensing apparatuses use a pixel array including a light-shielded area (optical black area) where light-shielded pixels are arranged, and an effective area where unshielded pixels are arranged.

According to techniques disclosed in Japanese Patent Laid-Open Nos. 10-126697 and 2006-025146, a black-level reference signal is read out from the light-shielded area, and the black level of a signal read out from the effective area is corrected using the readout black-level reference signal.

Recently, as the number of pixels increases and the semiconductor micropatterning technique advances, the unit pixel tends to be shrinked. Along with this, each element included in the unit pixel is also shrinked.

For example, an amplification transistor serving as a MOS transistor for amplifying a signal corresponding to charges generated in a photoelectric conversion unit in a unit pixel can be shrinked.

Letting W be the gate width of the amplification transistor, L be the gate length, and Cox be the gate insulating film capacitance per unit area, it is known that noise generated in the amplification transistor is inversely proportional to the square root of (W×L×Cox). That is, as the amplification transistor is shrinked to decrease the gate width or gate length, noise generated in the amplification transistor increases.

If the unit pixel is shrinked by the techniques disclosed in Japanese Patent Laid-Open Nos. 10-126697 and 2006-025146, noise generated in the amplification transistor increases in the effective area and light-shielded area, as described above. Particularly when noise generated in the amplification transistor in the light-shielded area increases, the amount of noise included in a black-level reference signal read out from the light-shielded area increases. This may decrease the precision of processing for correcting the black level of a signal read out from the effective area by using the readout black-level reference signal.

SUMMARY OF THE INVENTION

It is an aim of the present invention to reduce noise included in a black-level reference signal read out from a pixel in the light-shielded area.

According to the first aspect of the present invention, there is provided an image sensing apparatus comprising a pixel array including a light-shielded area where light-shielded pixels are arranged, and an effective area where non-light-shielded pixels are arranged, each of the light-shielded pixels including a first photoelectric conversion unit, a first charge-voltage converter which converts charges generated in the first photoelectric conversion unit into a voltage, and a first amplification transistor functioning as a MOS transistor which receives, at a gate, the voltage converted by the first charge-voltage converter, and each of the non-light-shielded pixels including a second photoelectric conversion unit, a second charge-voltage converter which converts charges generated in the second photoelectric conversion unit into a voltage, and a second amplification transistor functioning as a MOS transistor which receives, at a gate, the voltage converted by the second charge-voltage converter, wherein a gate capacitance of the first amplification transistor is larger than a gate capacitance of the second amplification transistor.

According to the second aspect of the present invention, there is provided an image sensing apparatus comprising a pixel array including a light-shielded area where light-shielded pixels are arranged, and an effective area where non-light-shielded pixels are arranged, each of the light-shielded pixels including a first photoelectric conversion unit, a first charge-voltage converter which converts charges generated in the first photoelectric conversion unit into a voltage, and a first amplification transistor functioning as a MOS transistor which receives, at a gate, the voltage converted by the first charge-voltage converter, and each of the non-light-shielded pixels including a second photoelectric conversion unit, a second charge-voltage converter which converts charges generated in the second photoelectric conversion unit into a voltage, and a second amplification transistor functioning as a MOS transistor which receives, at a gate, the voltage converted by the second charge-voltage converter, wherein the first amplification transistor is a buried-channel MOS transistor, and the second amplification transistor is a surface-channel MOS transistor.

According to the third aspect of the present invention, there is provided an imaging system comprising an image sensing apparatus according to claim 1; an optical system which forms an image on an image sensing surface of the image sensing apparatus; and a signal processing unit which processes a signal output from the image sensing apparatus to generate image data.

The present invention can reduce noise included in a black-level reference signal read out from a pixel in the light-shielded area.

Further features of the present invention will become apparent from the following description of exemplary embodiments with reference to the attached drawings.

DESCRIPTION OF THE EMBODIMENTS

Figure 1:
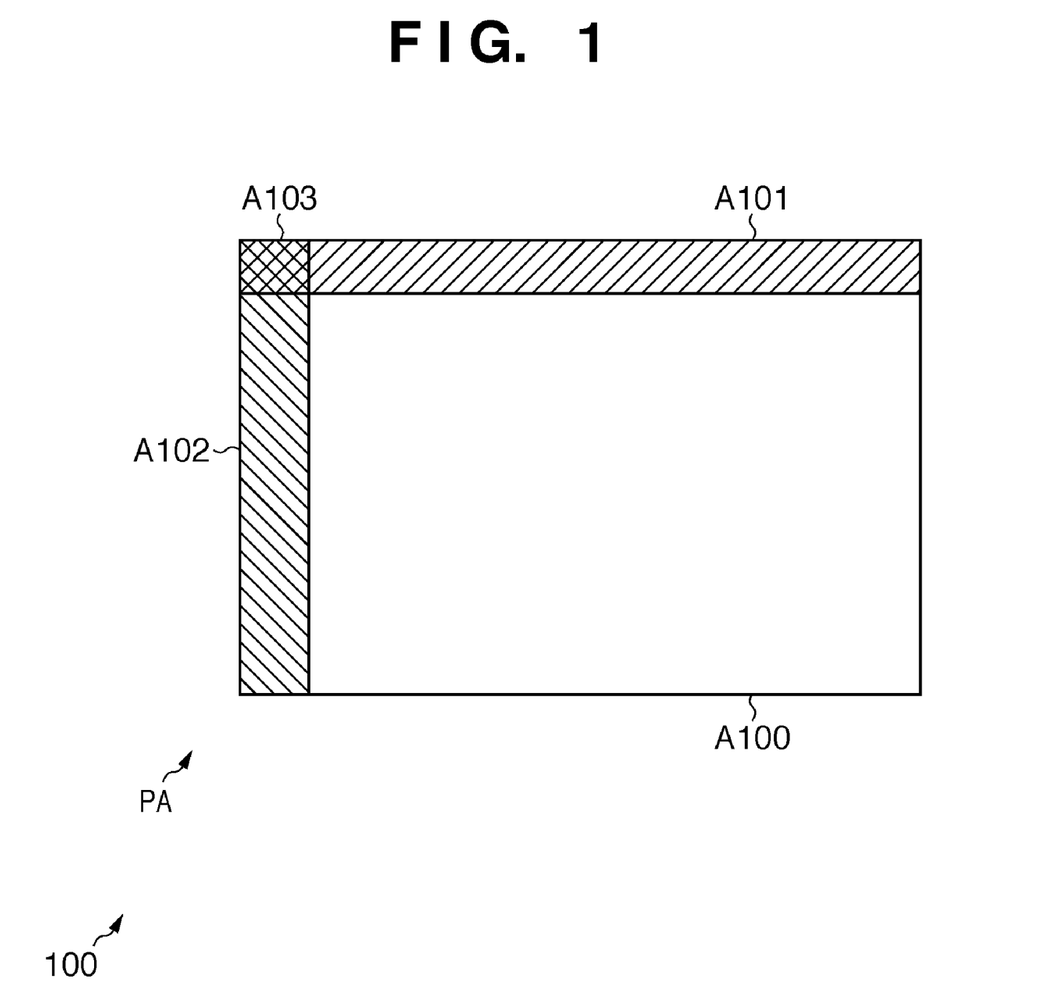
FIG. 1 is a view showing the arrangement of an image sensing apparatus 100 according to the first embodiment of the present invention.

An image sensing apparatus 100 according to the first embodiment of the present invention will be described with reference to FIG. 1. FIG. 1 is a view showing the arrangement of the image sensing apparatus 100 according to the first embodiment of the present invention.

The image sensing apparatus 100 includes a pixel array PA and peripheral circuits (not shown).

In the pixel array PA, pixels are arrayed in the row and column directions (two-dimensionally). The pixel array PA includes optical black areas (light-shielded areas: to be referred to as OB areas hereinafter) A101 to A103, and an effective area A100. The OB areas A101 to A103 are arranged around the effective area A100 in the pixel array PA. The OB areas are shielded from light by a light-shielding film and/or wiring layer.

The OB areas A101 to A103 include the vertical OB area A101, horizontal OB area A102, and vertical & horizontal OB area A103. The vertical OB area A101 is arranged adjacent to an end of the effective area A100 in the vertical direction. The horizontal OB area A102 is arranged adjacent to an end of the effective area A100 in the horizontal direction. The vertical & horizontal OB area A103 is arranged adjacent to the vertical OB area A101 and horizontal OB area A102, and also adjacent to the corner of the effective area A100.

In the OB areas A101 to A103, light-shielded pixels are arranged. In the effective area A100, unshielded pixels are arranged. Signals (black-level reference signals) in the light-shielded state are read out from pixels in the OB areas A101 to A103. Signals (optical signals) corresponding to light are read out from pixels in the effective area A100.

Peripheral circuits are arranged around the pixel array PA. The peripheral circuits include a vertical shift register (not shown) for driving each pixel of the pixel array PA, a readout circuit (not shown) for reading out a signal from each pixel of the pixel array PA, and a horizontal shift register (not shown).

Figure 2:
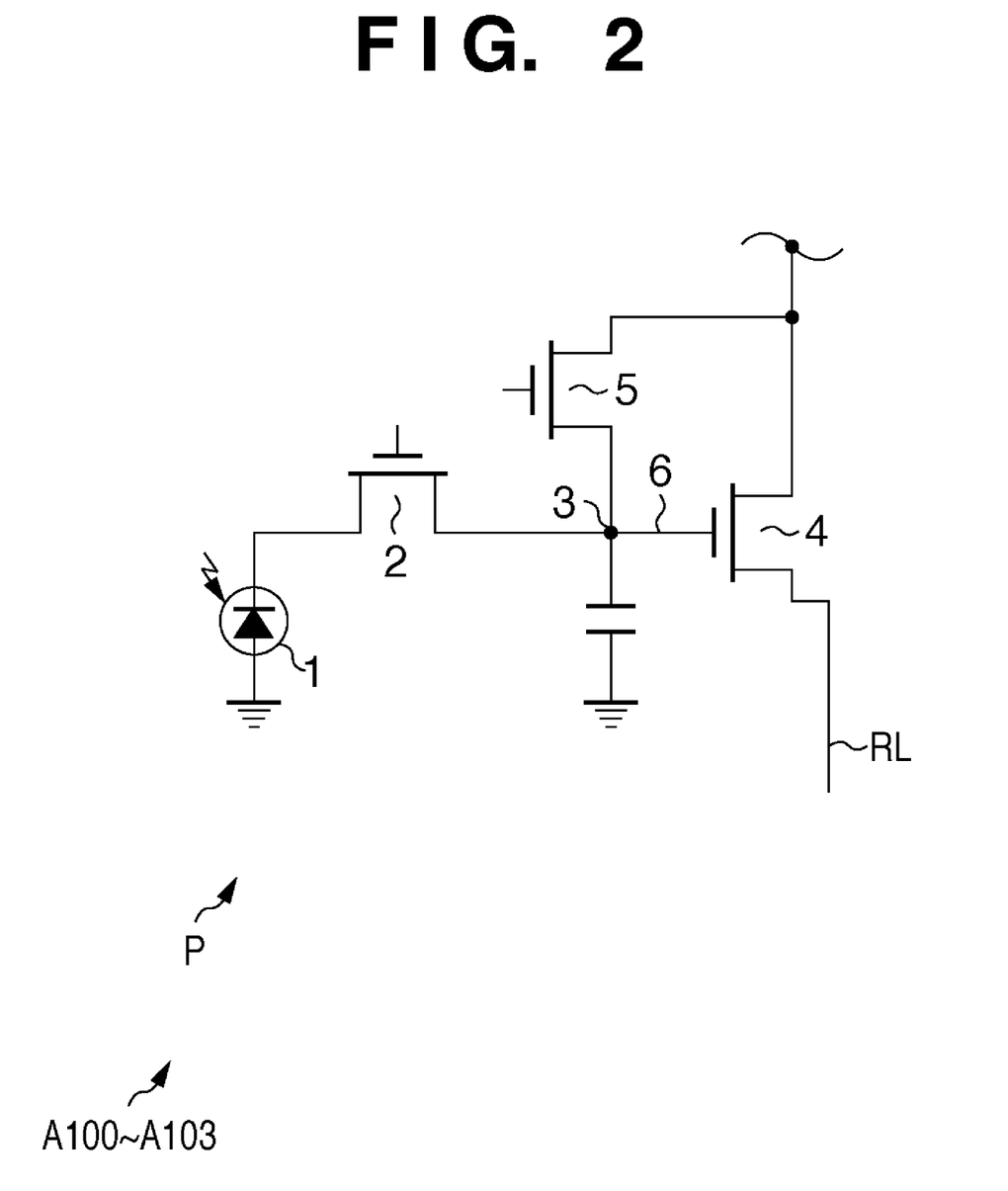
FIG. 2 is a circuit diagram showing the equivalent circuit of each pixel.

The schematic arrangement of each pixel P in the OB areas A101 to A103 and effective area A100 will be explained with reference to FIG. 2. FIG. 2 is a circuit diagram showing the equivalent circuit of each pixel.

Each pixel P includes a photoelectric converter (photoelectric conversion unit) 1, transfer transistor (transfer unit) 2, floating diffusion region (charge-voltage converter) 3, amplification transistor 4, connecting portion 6, and reset transistor 5.

The photoelectric converter 1 converts incident light into charges, and accumulates the converted charges. The photoelectric converter 1 is, for example, a photodiode.

The transfer transistor 2 is turned on upon receiving an active level signal at the gate from the vertical shift register, and transfers charges accumulated in the photoelectric converter 1 to the floating diffusion region 3. The transfer transistor 2 is turned off upon receiving an inactive level signal at the gate from the vertical shift register.

The floating diffusion region 3 converts transferred charges into a voltage. The floating diffusion region 3 functions as the input of the amplification transistor 4, and outputs a signal corresponding to the voltage to the amplification transistor 4 via the connecting portion 6.

The connecting portion 6 connects the floating diffusion region 3 and the gate of the amplification transistor 4. The connecting portion 6 is, for example, a metal wiring.

The amplification transistor 4 amplifies a signal input from the floating diffusion region 3. The amplification transistor 4 outputs the amplified signal to the above-mentioned readout circuit via a column signal line RL.

The reset transistor 5 is turned on upon receiving an active level signal at the gate from the vertical shift register, and resets the potential of the floating diffusion region 3 to a predetermined reset level. The reset transistor 5 is turned off upon receiving an inactive level signal at the gate from the vertical shift register.

The schematic operation of each pixel P in the OB areas A101 to A103 and effective area A100 will be explained with reference to FIG. 2.

After the reset transistor 5 of each pixel resets the floating diffusion region 3 to low level, the vertical shift register drives pixels on a readout row to reset the floating diffusion regions 3 of the pixels to high level. Then, in the pixel array PA, only the amplification transistors 4 of the pixels P on the readout row become active (turned on). In this state, the readout circuit reads out noise signals from the pixels P on the readout row.

Then, the vertical shift register drives the pixels P on the readout row to turn on the transfer transistors 2 and transfer charges accumulated in the photoelectric converters 1 to the floating diffusion regions 3. In this state, the readout circuit reads out optical signals from the pixels P on the readout row.

The differences between the noise signals and optical signals read out from the pixels P on the readout row are calculated by the readout circuit or a signal processing circuit (e.g., a sensed signal processing circuit 95 to be described later) outside the image sensing apparatus 100. Accordingly, noise removal processing (to be referred to as CDS processing hereinafter) by correlated double sampling can be performed.

The CDS processing is executed for signals (black-level reference signals) read out from pixels in the OB areas A101 to A103 and signals (optical signals) read out from the effective area. A correction circuit (e.g., an image signal processor 97 to be described later) in or on the output stage of the image sensing apparatus 100 performs processing (to be referred to as OB correction processing hereinafter) for correcting the black level of an optical signal having undergone CDS processing by using the black-level reference signal having undergone CDS processing.

Figure 3:
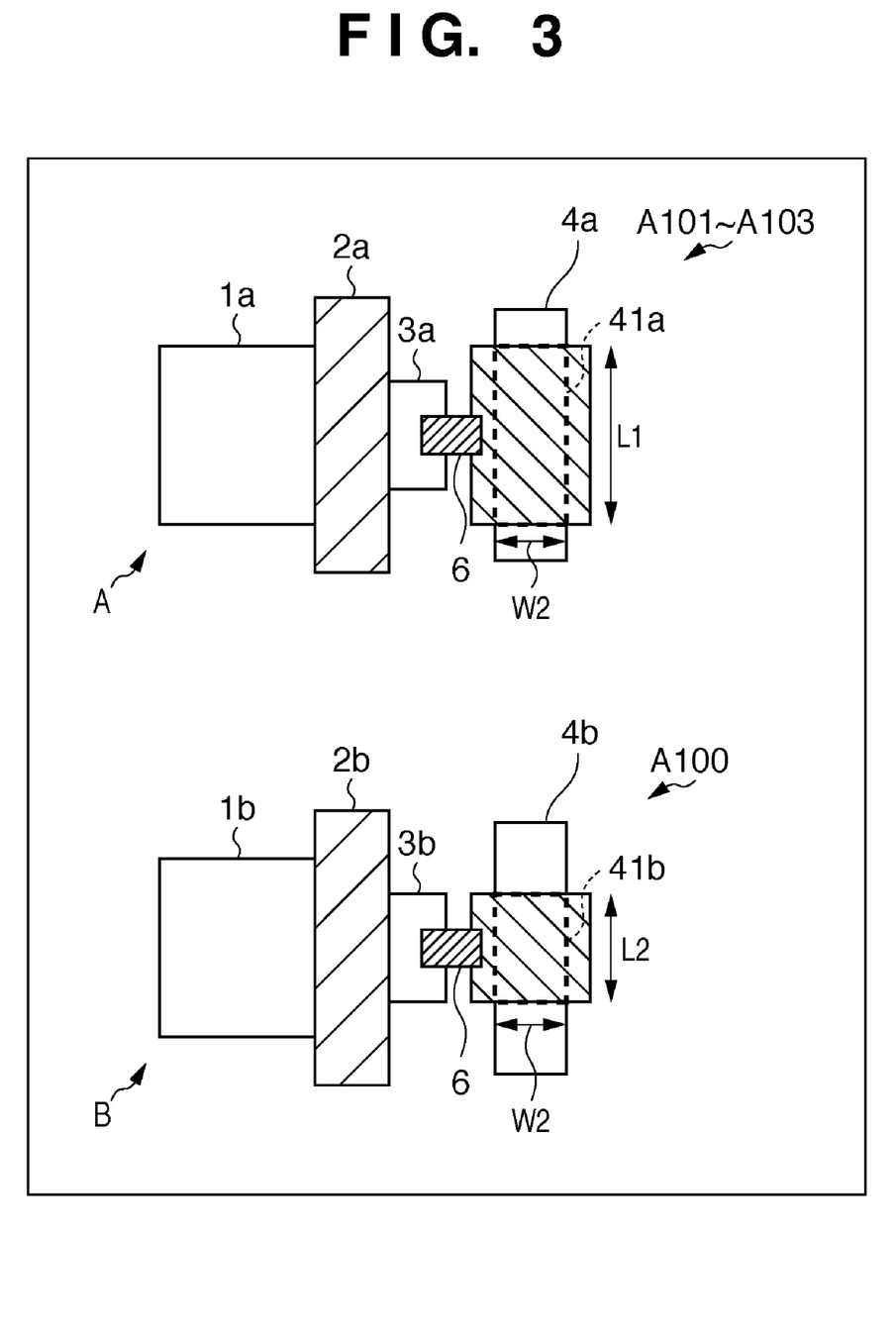
FIG. 3 is a view showing the layout of each pixel P.

A characteristic arrangement of each pixel P in the OB areas A101 to A103 and effective area A100 will be explained with reference to FIG. 3. FIG. 3 is a view showing the layout of each pixel P.

In FIG. 3, A represents the layout of each pixel in the OB areas A101 to A103. In FIG. 3, B represents the layout of each pixel in the effective area A100. In A and B of FIG. 3, the same reference numerals as those shown in FIG. 2 denote the same elements. In FIG. 3, the reset transistor 5 is not illustrated.

In A of FIG. 3, a portion surrounded by a broken line is a gate 41a of an amplification transistor (first amplification transistor) 4a. A transfer transistor (first transfer unit) 2a transfers charges accumulated in a photoelectric converter (first photoelectric conversion unit) 1a to a floating diffusion region (first charge-voltage converter) 3a. The floating diffusion region 3a converts the transferred charges into a voltage. The amplification transistor 4a receives, at the gate 41a, the voltage converted by the floating diffusion region 3a, and outputs a signal based on the received voltage to the column signal line RL (see FIG. 2).

In B of FIG. 3, a portion surrounded by a broken line is a gate 41b of an amplification transistor (second amplification transistor) 4b. A transfer transistor (second transfer unit) 2b transfers charges accumulated in a photoelectric converter (second photoelectric conversion unit) 1b to a floating diffusion region (second charge-voltage converter) 3b. The floating diffusion region 3b converts the transferred charges into a voltage. The amplification transistor 4b receives, at the gate 41b, the voltage converted by the floating diffusion region 3b, and outputs a signal based on the received voltage to the column signal line RL (see FIG. 2).

Letting W be the gate width of the amplification transistor 4, L be the gate length, and Cox be the gate insulating film capacitance per unit area, it is known that 1/f noise (flicker noise) generated in the amplification transistor 4 is inversely proportional to the square root of (W×L×Cox). The 1/f noise is generated by random trap and emission of charges at the interface between the channel region and gate insulating film below the gate electrode. As the amplification transistor 4 is shrinked to decrease the gate width or gate length, noise generated in the amplification transistor 4 increases.

Assume that the gate lengths of the amplification transistors 4 in the OB areas A101 to A103 and effective area A100 are increased from L2 to L1 (while keeping the gate widths unchanged). In this case, the mutual conductances of the amplification transistors 4 in the OB areas A101 to A103 and effective area A100 decrease respectively. Even if the potential of the floating diffusion region 3 remains unchanged, signal levels (potentials) output from the amplification transistors 4 drop. This can reduce noise generated in the amplification transistors 4 in the OB areas A101 to A103 and effective area A100. However, the amplitude of a signal output from a pixel in the effective area A100 decreases. It becomes difficult to ensure the dynamic range of an output signal from a pixel in the effective area A100.

On the contrary, according to the first embodiment, the gate length L1 of the amplification transistors 4a in the OB areas A101 to A103 is set larger than the gate length L2 of the amplification transistor 4b in the effective area A100, as shown in FIG. 3. Meanwhile, the gate width W2 of the amplification transistors 4a in the OB areas A101 to A103 is set substantially equal to the gate width W2 of the amplification transistor 4b in the effective area A100.

More specifically, the gate capacitance of the amplification transistors 4a in the OB areas A101 to A103 is larger than that of the amplification transistor 4b in the effective area A100. Hence, 1/f noise (flicker noise) of the amplification transistors 4a in the OB areas A101 to A103 becomes smaller than that of the amplification transistor 4b in the effective area A100. Even when the dynamic range of an output signal from a pixel in the effective area A100 is ensured, noise included in black-level reference signals read out from pixels in the OB areas A101 to A103 can be reduced. As a result, the precision of OB correction processing executed using the black-level reference signals can be increased, obtaining a high-quality image.

It should be noted that output signals from the OB areas A101 to A103 are always at the black level, and that the fluctuation component is only a dark current component. The level of output signals from the OB areas A101 to A103 originally hardly varies, compared with the effective area, so the dynamic range of the output signals does not matter. In the OB areas A101 to A103, therefore, the gate length of the amplification transistor 4 can be elongated as long as the layout permits, without subjecting to the limitation of the dynamic range.

When OB correction processing is done using one or two of the vertical OB area A101, horizontal OB area A102, and vertical & horizontal OB area A103, only the gate lengths of pixels included in the used areas are desirably increased.

Figure 4:
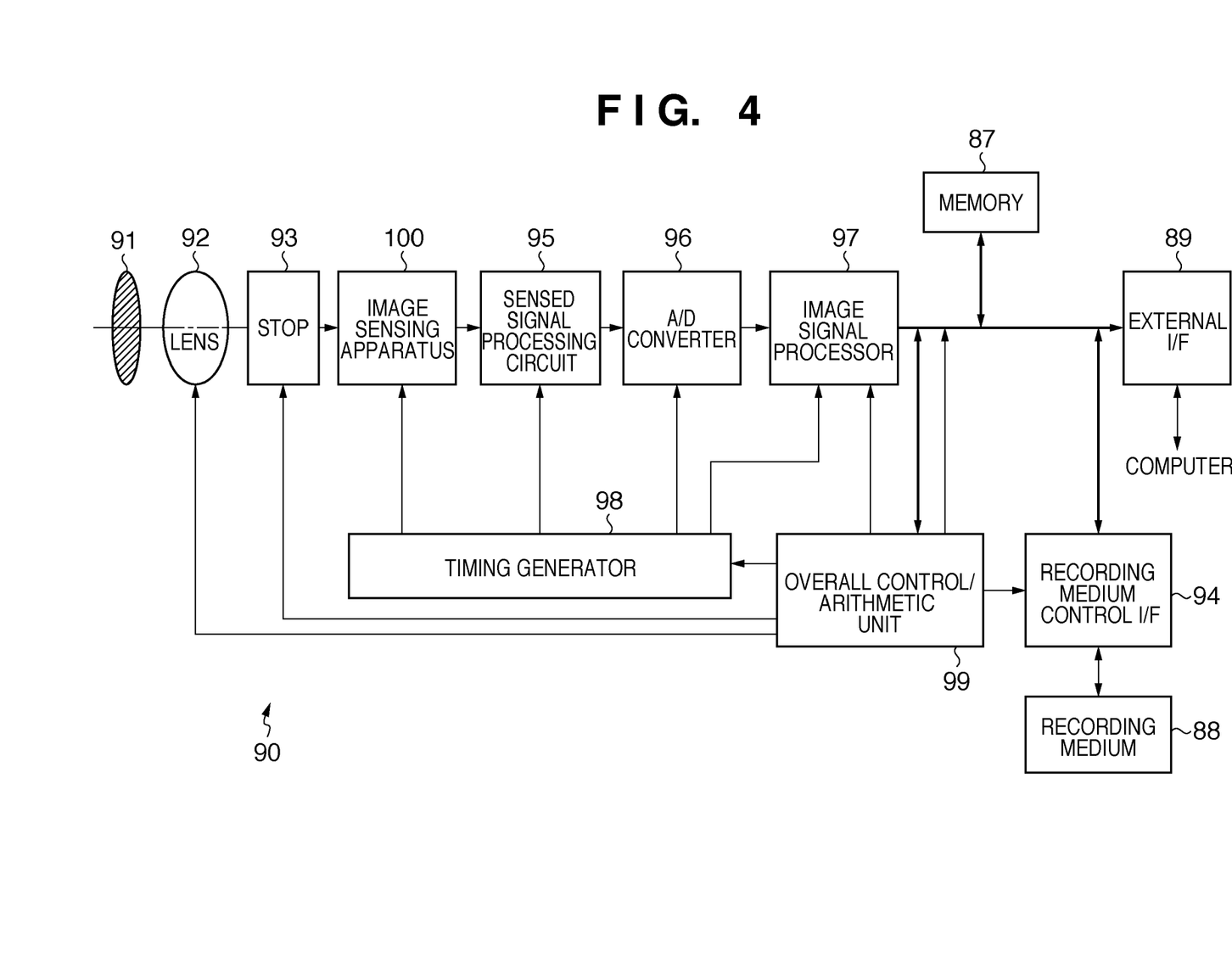
FIG. 4 is a block diagram of the arrangement of an imaging system to which the image sensing apparatus according to the first embodiment is applied.

FIG. 4 shows an example of an imaging system to which the image sensing apparatus according to the present invention is applied.

As shown in FIG. 4, an imaging system 90 mainly includes an optical system, the image sensing apparatus 100, and a signal processing unit. The optical system mainly includes a shutter 91, lens 92, and stop 93. The signal processing unit mainly includes the sensed signal processing circuit 95, an A/D converter 96, the image signal processor 97, a memory 87, an external I/F 89, a timing generator 98, an overall control/arithmetic unit 99, a recording medium 88, and a recording medium control I/F 94. The signal processing unit may not include the recording medium 88.

The shutter 91 is arranged in front of the lens 92 on the optical path to control the exposure.

The lens 92 refracts incident light to form an object image on the pixel array (image sensing surface) of the image sensing apparatus 100.

The stop 93 is interposed between the lens 92 and the image sensing apparatus 100 on the optical path. The stop 93 adjusts the quantity of light guided to the image sensing apparatus 100 after passing through the lens 92.

The image sensing apparatus 100 converts an object image formed on the pixel array into an image signal. The image sensing apparatus 100 reads out the image signal from the pixel array, and outputs it.

The sensed signal processing circuit 95 is connected to the image sensing apparatus 100, and processes an image signal output from the image sensing apparatus 100.

The A/D converter 96 is connected to the sensed signal processing circuit 95. The A/D converter 96 converts a processed image signal (analog signal) output from the sensed signal processing circuit 95 into an image signal (digital signal).

The image signal processor 97 is connected to the A/D converter 96. The image signal processor 97 performs various arithmetic processes such as correction for an image signal (digital signal) output from the A/D converter 96, generating image data. The image signal processor 97 supplies the image data to the memory 87, external I/F 89, overall control/arithmetic unit 99, recording medium control I/F 94, and the like.

The memory 87 is connected to the image signal processor 97, and stores image data output from the image signal processor 97.

The external I/F 89 is connected to the image signal processor 97. Image data output from the image signal processor 97 is transferred to an external device (e.g., a personal computer) via the external I/F 89.

The timing generator 98 is connected to the image sensing apparatus 100, sensed signal processing circuit 95, A/D converter 96, and image signal processor 97. The timing generator 98 supplies timing signals to the image sensing apparatus 100, sensed signal processing circuit 95, A/D converter 96, and image signal processor 97. The image sensing apparatus 100, sensed signal processing circuit 95, A/D converter 96, and image signal processor 97 operate in synchronism with the timing signals.

The overall control/arithmetic unit 99 is connected to the timing generator 98, image signal processor 97, and recording medium control I/F 94, and comprehensively controls them.

The recording medium 88 is detachably connected to the recording medium control I/F 94. The image data output from the image signal processor 97 is recorded on the recording medium 88 via the recording medium control I/F 94.

With this arrangement, the image sensing apparatus 100 can provide a high-quality image (image data) as long as it can obtain a high-quality image signal.

Figure 5:
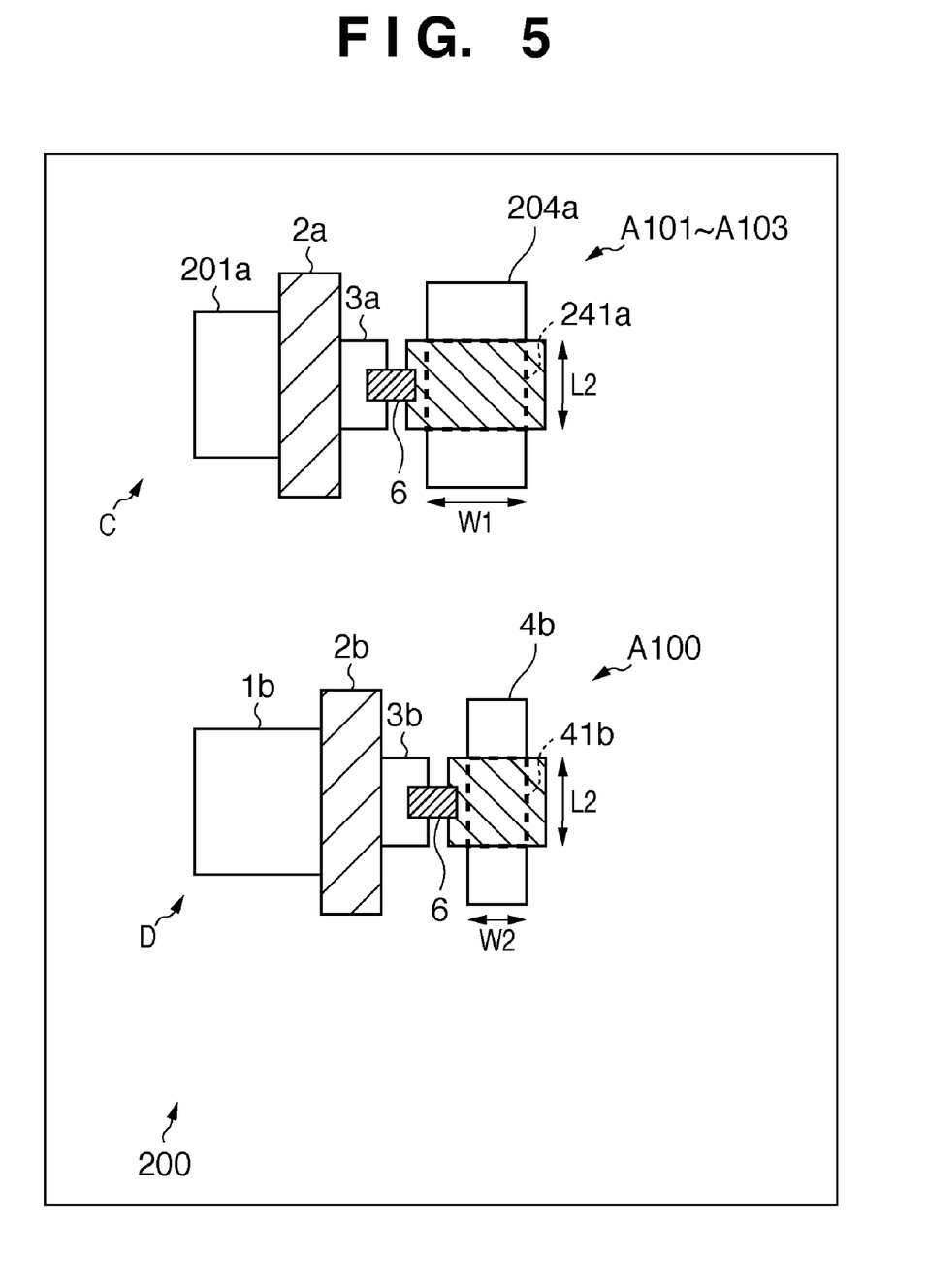
FIG. 5 is a view showing the arrangement of an image sensing apparatus 200 according to the second embodiment of the present invention.

An image sensing apparatus 200 according to the second embodiment of the present invention will be explained. A difference from the first embodiment will be mainly explained.

As shown in FIG. 5, the image sensing apparatus 200 is different from the first embodiment in the layout of each pixel P in OB areas A101 to A103. In FIG. 5, C represents the layout of each pixel in the OB areas A101 to A103. In FIG. 5, D represents the layout of each pixel in an effective area A100.

In C and D of FIG. 5, portions surrounded by broken lines are gates 241a and 41b of amplification transistors 204a and 4b.

Assume that the gate widths of amplification transistors 4 in the OB areas A101 to A103 and effective area A100 are increased from W2 to W1 (while keeping the gate lengths unchanged). In this case, to keep the pixel area constant, the light-receiving areas of photoelectric converters 1 in the OB areas A101 to A103 and effective area A100 are decreased respectively. Although this can reduce noise generated in the amplification transistors 4 each in the OB areas A101 to A103 and effective area A100, the sensitivity of the photoelectric converter 1 in the effective area A100 decreases. As a result, the level of an output signal from a pixel in the effective area A100 drops, and the quality of an image signal may degrade.

On the contrary, according to the second embodiment, the gate width W1 of the amplification transistors 204a in the OB areas A101 to A103 is set larger than the gate width W2 of the amplification transistor 4b in the effective area A100, as shown in FIG. 5. Meanwhile, the gate length L2 of the amplification transistors 204a in the OB areas A101 to A103 is set substantially equal to the gate length L2 of the amplification transistor 4b in the effective area A100. That is, a gate capacitance of the amplification transistors 204a in the OB areas A101 to A103 is set larger than a gate capacitance of the amplification transistor 4b in the effective area A100.

The second embodiment can reduce noise included in black-level reference signals read out from pixels in the OB areas A101 to A103 while preventing a decrease in the level of output signals from pixels in the effective area A100.

It should be noted that, in the OB areas A101 to A103, the light-receiving area of a photoelectric converter 201a decreases because the gate width of the amplification transistor 204a increases. The OB areas A101 to A103 are formed to output black-level reference signals without receiving light, so the small light-receiving area of the photoelectric converter 201a does not matter, as long as a black-level output from the effective area A100 is set to be almost equal to black-level outputs from the OB areas A101 to A103.

When OB correction processing is done using one or two of the vertical OB area A101, horizontal OB area A102, and vertical & horizontal OB area A103, only the gate lengths of pixels included in the used areas are desirably increased.

The layout of each pixel in the OB areas A101 to A103 may also be a combination of the first and second embodiments. More specifically, the amplification transistor of each pixel in the OB areas A101 to A103 may also be larger in gate length and gate width than the amplification transistor in the effective area.

Figure 6:
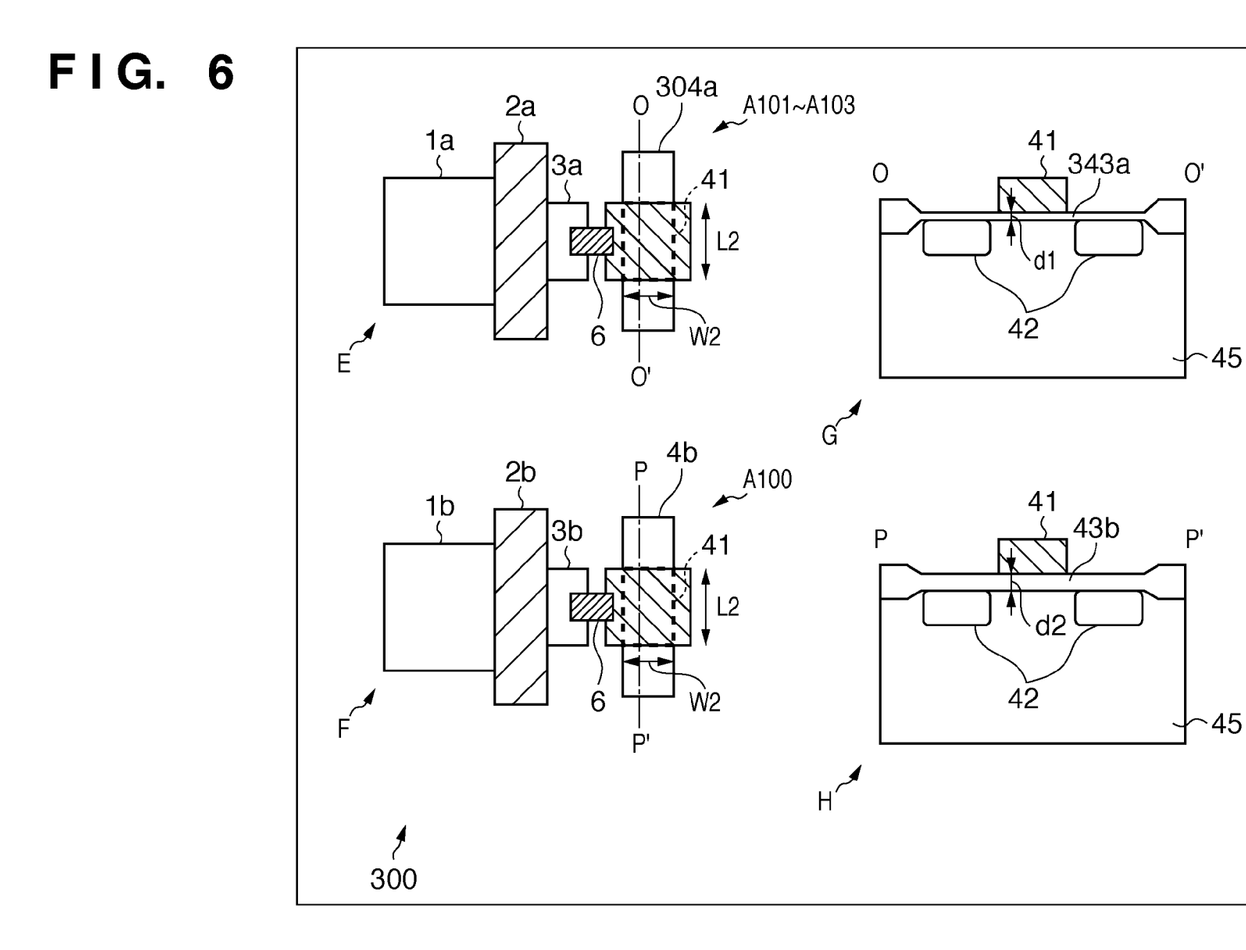
FIG. 6 is a view showing the arrangement of an image sensing apparatus 300 according to the third embodiment of the present invention.

An image sensing apparatus 300 according to the third embodiment of the present invention will be explained. A difference from the first embodiment will be mainly explained.

As shown in FIG. 6, the image sensing apparatus 300 is different from the first embodiment in the layout of each pixel P in OB areas A101 to A103. In FIG. 6, E and G represent the layout and sectional structure of each pixel in the OB areas A101 to A103. In FIG. 6, F and H represent the layout and sectional structure of each pixel in an effective area A100.

In FIG. 6, G represents a section of an amplification transistor 304a taken along the line O-O' in the OB areas A101 to A103. In FIG. 6, H represents a section of an amplification transistor 4b taken along the line P-P' in the effective area A100.

It is known that the gate insulating film capacitance (gate capacitance) Cox per unit area is inversely proportional to the thickness of the gate insulating film. That is, 1/f noise is proportional to the square root of the thickness of the gate insulating film.

Assume that the thicknesses of the gate insulating films of amplification transistors 4 in the OB areas A101 to A103 and effective area A100 are decreased from d2 to d1 (while keeping the gate areas unchanged). In this case, the gate breakdown voltages of the amplification transistors 4 in the OB areas A101 to A103 and effective area A100 drop. Particularly, the gate insulting film of the amplification transistor 4 in the image sensing apparatus 100 may deteriorate because a voltage applied to the gate sometimes fluctuates to raise the voltage between the gate and the drain (or source). If the gate insulting film deteriorates, noise generated in the amplification transistor 4 may increase in the effective area A100. To prevent the gate insulting film from deteriorating, the breakdown voltage needs to be ensured to a certain degree.

On the contrary, according to the third embodiment, the thickness d1 of gate insulating films 343a of the amplification transistors 304a in the OB areas A101 to A103 is smaller than the thickness d2 of a gate insulating film 43b of the amplification transistor 4b in the effective area A100, as shown in FIG. 6. Meanwhile, the gate length L2 and gate width W2 of the amplification transistors 304a in the OB areas A101 to A103 are equal to the gate length L2 and gate width W2 of the amplification transistor 4b in the effective area A100. That is, a gate capacitance of the amplification transistors 304a in the OB areas A101 to A103 is set larger than a gate capacitance of the amplification transistor 4b in the effective area A100.

The third embodiment can reduce noise included in black-level reference signals read out from pixels in the OB areas A101 to A103 while preventing a decrease in the gate breakdown voltage of the amplification transistor 304a of a pixel in the effective area A100.

It should be noted that, since the thickness d1 of the gate insulating films 343a of the amplification transistors 304a in the OB areas A101 to A103 is small, the gate breakdown voltage of the amplification transistor 304a drops. However, an almost constant black-level voltage is applied to the gate insulating films 343a of the amplification transistors 304a in the OB areas A101 to A103. Thus, the voltage between the gate and the drain (or source) can also be set low. Hence, the low gate breakdown voltage of the amplification transistors 304a in the OB areas A101 to A103 does not matter.

When OB correction processing is done using one or two of the vertical OB area A101, horizontal OB area A102, and vertical & horizontal OB area A103, the thicknesses of the gate insulating films of pixels in the used areas are desirably decreased.

The pixel in the OB areas A101 to A103 may also be a combination of the third embodiment and at least one of the first and second embodiments.

Figure 7:
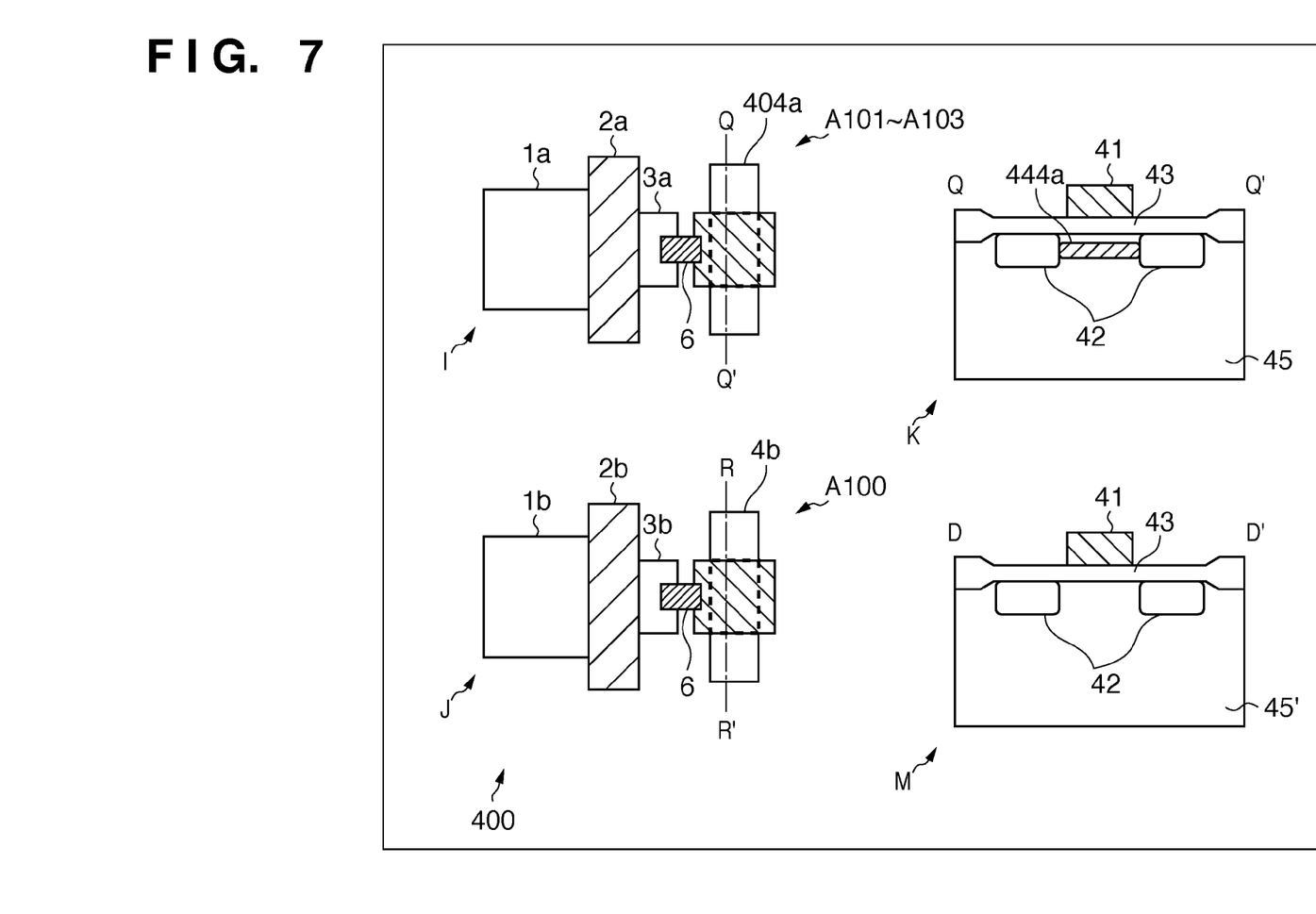
FIG. 7 is a view showing the arrangement of an image sensing apparatus 400 according to the fourth embodiment of the present invention.

An image sensing apparatus 400 according to the fourth embodiment of the present invention will be explained. A difference from the first embodiment will be mainly explained.

As shown in FIG. 7, the image sensing apparatus 400 is different from the first embodiment in the layout of each pixel P in OB areas A101 to A103. In FIG. 7, I and K represent the layout and sectional structure of each pixel in the OB areas A101 to A103. In FIG. 7, J and M represent the layout and sectional structure of each pixel in an effective area A100.

In FIG. 7, K represents a section of an amplification transistor 404a taken along the line Q-Q' in the OB areas A101 to A103. In FIG. 7, M represents a section of an amplification transistor 4b taken along the line R-R' in the effective area A100.

The amplification transistors 404a in the OB areas A101 to A103 are respectively buried-channel transistors, each having a buried-channel forming diffusion region 444a. The amplification transistor 4b in the effective area A100 is a surface-channel transistor. In a transistor with a general surface-channel structure, the channel is formed near the interface of the insulating film, and readily influenced by defects present at the interface of the insulating film, readily generating noise. In contrast, in a transistor with the buried-channel structure, the channel is formed at a position spaced apart from the interface of the insulating film, and hardly influenced by defects at the interface of the insulating film.

The fourth embodiment can reduce noise included in black-level reference signals read out from pixels in the OB areas A101 to A103 without forming a buried-channel transistor as the amplification transistor 4b of a pixel in the effective area A100.

It should be noted that, when the buried-channel forming diffusion region 444a is formed in only the channel region of the amplification transistor 404a in the OB areas A101 to A103, only the amplification transistor 404a in the OB areas A101 to A103 can be formed from a buried-channel transistor. The buried-channel forming diffusion region 444a can be formed by implanting impurity ions of a conductivity type opposite to that of a semiconductor substrate 45. When the amplification transistor 404a is of an NMOS type, the semiconductor substrate 45 is a P-type impurity region. The buried-channel forming diffusion region 444a can be implemented as an N-type impurity region formed by, for example, arsenic ion implantation. When the amplification transistor 404a is of an PMOS type and the semiconductor substrate 45 is an N-type impurity region, the buried-channel forming diffusion region 444a can be an P-type impurity region. In addition, an arrangement of a pixel in the OB areas A101 to A103 may be obtained by incorporating, in the arrangement of the fourth embodiment, the arrangement of other embodiments.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-016842, filed Jan. 28, 2008, which is hereby incorporated by reference herein in its entirety.

What is claimed is:

1. An image sensing apparatus comprising a pixel array including a light-shielded area where light-shielded pixels are arranged, and an effective area where non-light-shielded pixels are arranged,
    each of the light-shielded pixels including
        a first photoelectric conversion unit,
        a first charge-voltage converter which converts charges generated in the first photoelectric conversion unit into a voltage, and
        a first amplification transistor functioning as a MOS transistor which receives, at a gate, the voltage converted by the first charge-voltage converter, and
    each of the non-light-shielded pixels including
        a second photoelectric conversion unit,
        a second charge-voltage converter which converts charges generated in the second photoelectric conversion unit into a voltage, and
        a second amplification transistor functioning as a MOS transistor which receives, at a gate, the voltage converted by the second charge-voltage converter,
    wherein a gate capacitance of the first amplification transistor is larger than a gate capacitance of the second amplification transistor.

2. The apparatus according to claim 1, wherein a gate area of the first amplification transistor is larger than a gate area of the second amplification transistor.

3. The apparatus according to claim 2, wherein a gate length of the first amplification transistor is larger than a gate length of the second amplification transistor.

4. The apparatus according to claim 2, wherein a gate width of the first amplification transistor is larger than a gate width of the second amplification transistor.

5. The apparatus according to claim 1, wherein a gate capacitance per unit area in the first amplification transistor is larger than a gate capacitance per unit area in the second amplification transistor.

6. The apparatus according to claim 5, wherein a thickness of a gate insulating film of the first amplification transistor is smaller than a thickness of a gate insulating film of the second amplification transistor.

7. An image sensing apparatus comprising a pixel array including a light-shielded area where light-shielded pixels are arranged, and an effective area where non-light-shielded pixels are arranged,
    each of the light-shielded pixels including
        a first photoelectric conversion unit,
        a first charge-voltage converter which converts charges generated in the first photoelectric conversion unit into a voltage, and
        a first amplification transistor functioning as a MOS transistor which receives, at a gate, the voltage converted by the first charge-voltage converter, and
    each of the non-light-shielded pixels including
        a second photoelectric conversion unit,
        a second charge-voltage converter which converts charges generated in the second photoelectric conversion unit into a voltage, and
        a second amplification transistor functioning as a MOS transistor which receives, at a gate, the voltage converted by the second charge-voltage converter,
    wherein the first amplification transistor is a buried-channel MOS transistor, and
    the second amplification transistor is a surface-channel MOS transistor.

8. An imaging system comprising:
    an image sensing apparatus according to claim 1;
    an optical system which forms an image on an image sensing surface of the image sensing apparatus; and
    a signal processing unit which processes a signal output from the image sensing apparatus to generate image data.

* * * * *